Oct. 18, 1966 W. B. HUBER ETAL 3,279,264

TUNING APPARATUS

Filed Aug. 3, 1964

2 Sheets-Sheet 1

Inventors:
William B. Huber
Russell D. Williams
By: Mueller and Aichele
Attys.

Inventors:
William B. Huber
Russell D. Williams
By: Mueller and Aichele
Attys.

United States Patent Office 3,279,264
Patented Oct. 18, 1966

3,279,264
TUNING APPARATUS

William B. Huber, Park Forest, and Russell D. Williams, Chicago, Ill., assignors to Motorola, Inc., Chicago, Ill., a corporation of Illinois Filed Aug. 3, 1964, Ser. No. 387,072
6 Claims. (Cl. 74—10.33)

This invention relates to wave signal tuning apparatus, and more particularly to a mechanism providing coarse and fine tuning adjustment of a wave signal tuner.

It is often a desirable feature in wave signal tuning apparatus, especially at the higher frequencies, to have provision for both coarse and fine tuning. For example, in ultra high frequency (UHF) television reception, there may be a large number of receivable channels within a relatively wide frequency spectrum. Thus, it is desirable to be able to move rapidly over the full frequency spectrum by coarse tuning, and yet be able to fine tune the receiver by precisely positioning the tuning mechanism for optimum reception because there is little margin for error. Where preset tuning is utilized, such as for example by the depression of pushbutton actuable slide assemblies as is well known with respect to automotive radio tuners, the setting of the tuner mechanism must be exactly correct before presetting the slide assemblies for repetitive accuracy.

Convenience suggests using a single knob driven control shaft for both coarse and fine adjustment of a tuner. Numerous arrangements for accomplishing both coarse and fine tuning from a single knob driven control shaft have been proposed. For the most part, such arrangements have been unduly complex and expensive, and have involved manipulation of the knob in addition to turning it, such as pushing or pulling, in order to change from the coarse to the fine tuning operations.

It is an object of this invention to provide an improved mechanism for wave signal tuning apparatus.

It is another object of the invention to provide wave signal tuning apparatus wherein either coarse or fine tuning may be accomplished by means of a single knob driven control shaft, with a minimum of manipulation being necessary.

Still another object of the invention is to provide a low cost and reliable tuner mechanism for wave signal tuning apparatus, which may be coarse or fine tuned by turning a single control shaft.

A feature of the invention is the provision of a tuning mechanism having inner and outer mutually concentric worms in threaded engagement and rotatable as a unit for coarse tuning, or with the inner worm turnable with respect to the outer worm for fine tuning.

Another feature of the invention is the provision of inner and outer mutually concentric worms in threaded engagement, with the outer worm being in threaded engagement with a driven gear, and with the threads engaging the outer worm and the driven gear being of substantially greater pitch than the pitch of the inter-engaging threads between the two worms.

Referring now to the drawings.

In accordance with the invention, a tuner mechanism is constructed for providing coarse and fine tuning adjustment of a tuner gear by rotation of a single control shaft. The mechanism includes inner and outer mutually concentric worms in threaded engagement, with the outer worm being in threaded engagement with the tuner gear and with the threads engaging the outer worm with the tuner gear being of substantially greater pitch than the pitch of the threads engaging the inner and outer worms. The control shaft may be driven by a knob and is coupled to the inner worm to rotate the inner worm. Stop means are provided on the inner worm for engaging the outer worm and turning the outer worm with the inner one as a single unit, thereby coarse tuning the tuner by rotating the tuning gear through rotation of the outer worm. The stop means is disengaged from the outer worm for a given amount of reverse rotation of the inner worm to permit the inner worm to turn relative to the outer worm. This drives the outer worm axially with respect to the inner worm to fine tune the tuner by rotating the tuner gear at a much greater transmission reduction.

Figure 1:
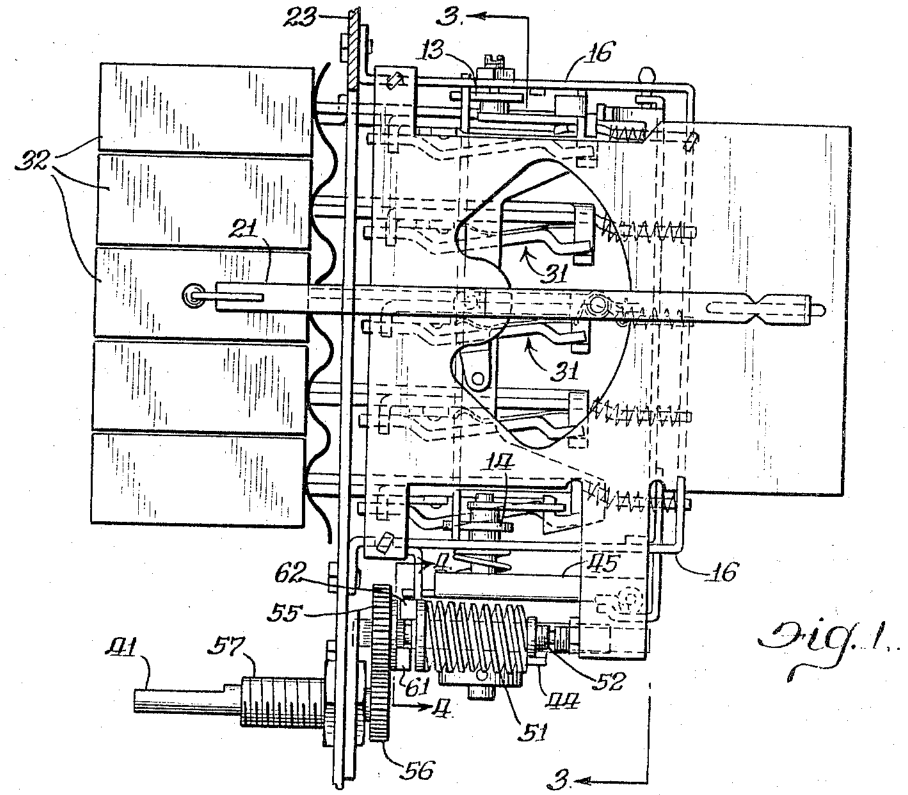
FIG. 1 is a side elevational view of a tuner mechanism constructed in accordance with the invention.
Figure 2:
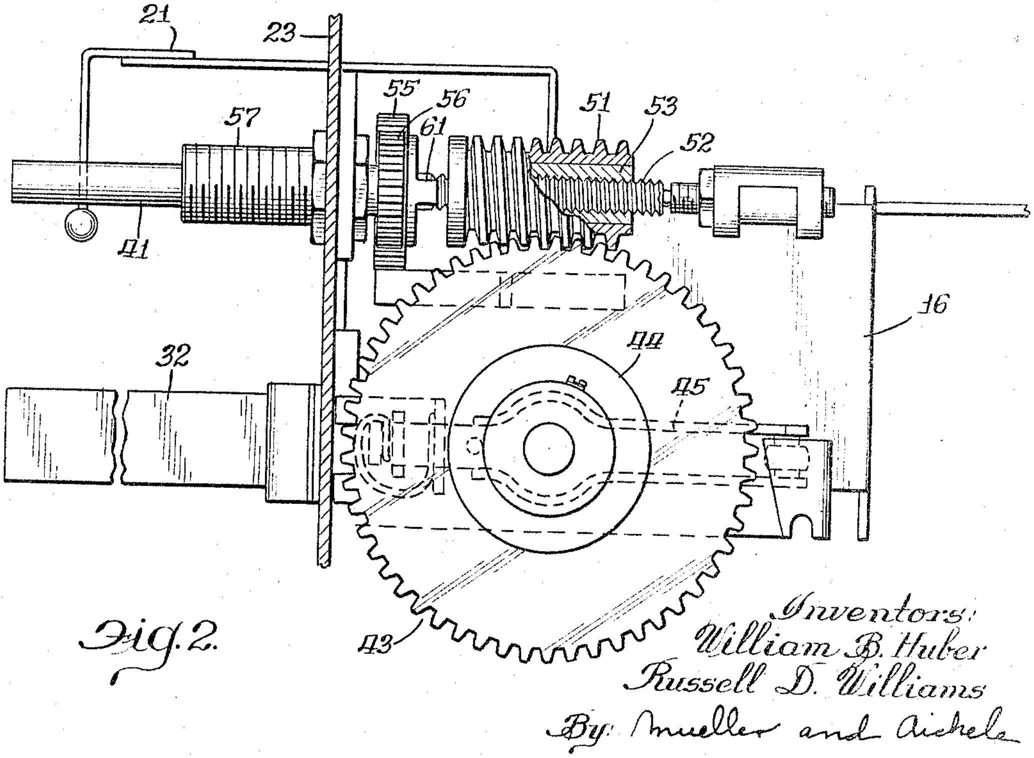
FIG. 2 is an enlarged view of the bottom of the tuner mechanism of FIG. 1.
Figures 3, 4:
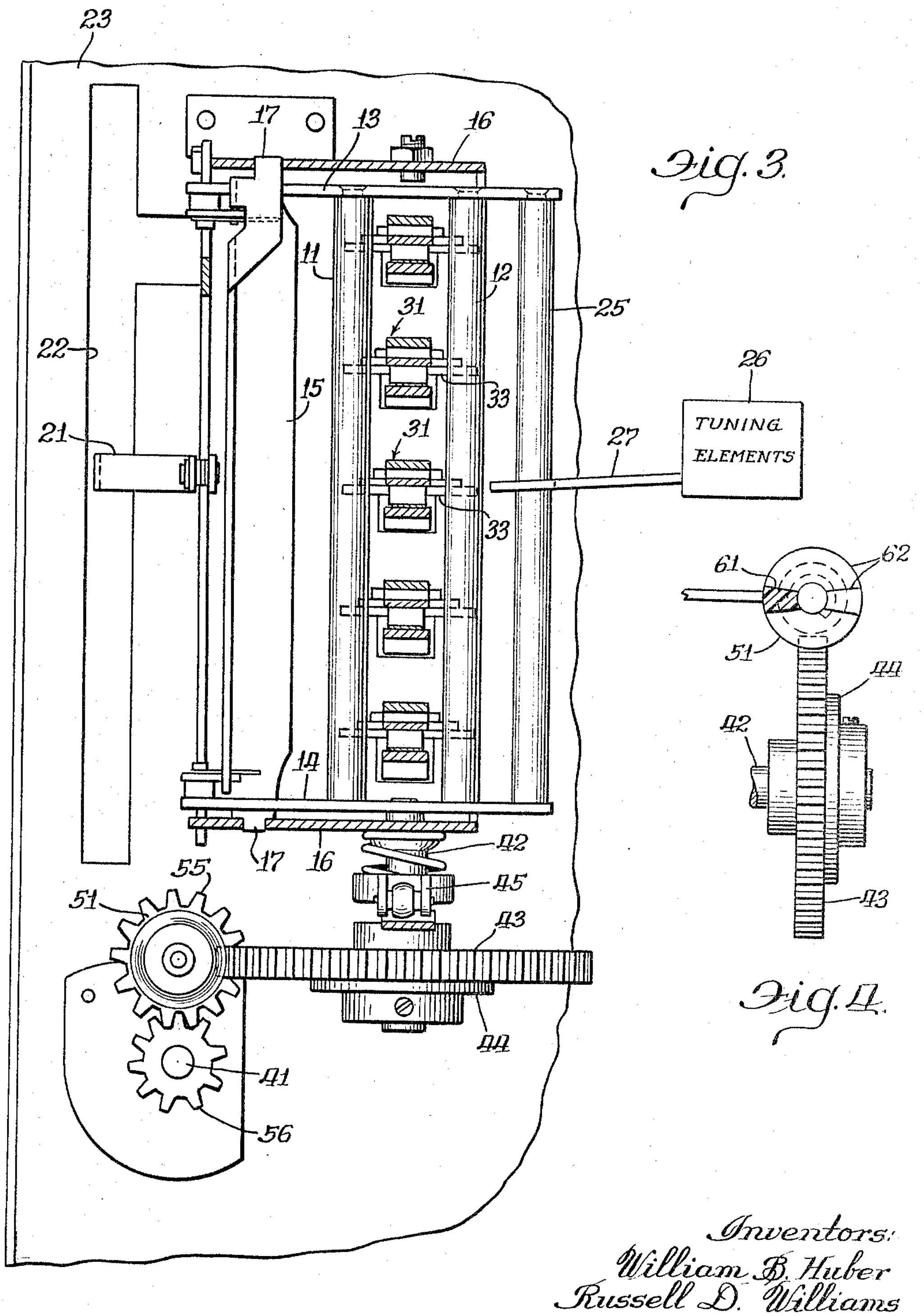
FIG. 3 is an enlarged sectional view taken along the line 3—3 of FIG. 1.
FIG. 4 is an enlarged sectional view taken along the line 4—4 of FIG. 1.

Referring now more particularly to the drawings, the general construction of the tuner drive mechanism of the invention may be seen. The mechanism incorporates a treadle type assembly consisting of cross bars 11 and 12 extending between pivotal arms 13 and 14. Arms 13 and 14 are pivotally connected at one end to a tuning carriage 15 which is linearly displaceable upon pivoting of arms 13 and 14. Carriage 15 is guided in frame 16 by means of tabs 17 which extend into elongated slots in the frame. Carriage 15 may be utilized to position tuning elements, such as tuning coil cores and tuning capacitors, which are incorporated in the electrical circuitry of the wave signal apparatus being tuned. A further cross bar 25 extends between arms 13 and 14. Cross bar 25 may alternatively or additionally be utilized to position tuning elements represented at 26 by means of an appropriate connecting linkage shown as a pivotal forked arm 27 in FIG. 3. An indicator arm 21 extends through a slot 22 in the front panel 23 of the tuner for indicating the frequency to which the mechanism is positioned, according to the position of carriage 15, as is well known in the art.

A plurality of pushbutton operable slide assemblies 31 are aligned with cross bars 11 and 12 and may be depressed upon depression of a respective one of their associated pushbuttons 32 to engage a presettable cam 33 carried on the slide assembly with the cross bars 11 and 12. This brings the cross bars into alignment with the cam to position arms 13 and 14 in a desired manner according to the setting of a particular cam, as is well known in the art. (See, for example, the patent of Thompson, No. 2,811,045.)

Arms 13 and 14 may also be pivoted by turning a knob, not shown, on control shaft 41. Control shaft 41 is coupled to rotate tuner shaft 42 which is connected to arm 14, by means of a torque transmission arrangement which provides both coarse and fine tuning. Tuner shaft 42 is connected to a tuner gear 43 by means of a clutch plate 44. Upon depression of one of slide assemblies 31, a lever 45 is pivoted to move gear 43 axially along control shaft 42 and out of engagement with clutch plate 44, as is well known in the art. (See Thompson Patent No. 2,793,531.) This decouples the torque transmission arrangement from the cross bars to present less resistance to the slide assembly being pushed.

Gear 43 is driven by an outer worm 51 which is concentric with an inner worm 52. Outer worm 51 includes an internally threaded bushing 53 which is force fit therein to maintain threaded engagement between worm 52 and worm 51. The outer worm 51 and bushing 53 may be provided as a single member in some applications. The pitch of the threads engaging worm 51 with worm 52 is substantially less than the pitch of the threads engaging worm 51 with gear 43. Worm 52 is directly driven by a gear 55 which in turn is driven by a gear 56 attached to control shaft 41. Control shaft 41 is held to the tuner frame 23 by means of a bushing 57. Accordingly worm 52 may be rotated by turning control shaft 41.

Gear 55 has a projection 61 extending therefrom. A similar projection 62 extends from worm 51, and is engaged by projection 61 upon sufficient rotation of gear 55. Thus when gear 55 is rotated to bring projection 61 into engagement with projection 62, continued rotation of gear 55 in the same direction will rotate worm 51 with worm 52 as a unit, and will drive tuner gear 43 according to the pitch of the outer threads on worm 51. This will pivot the arms 13 and 14 for coarse tuning the receiver.

Fine tuning is accomplished when gear 55 is rotated in the reverse direction to disengage projection 61 from projection 62. For the limited period of rotation of gear 55 during which projections 61 and 62 are disengaged, worm 52 will turn relative to worm 51. This is because the resistance of worm 51 to turning is greater than the resistance of worm 52 to turning within worm 51, due to the fact that the pitch of the threads engaging worm 51 with tuner gear 43 is greater than the pitch of the threads engaging worm 52 with worm 51. As a result, worm 51 will move axially along worm 52 in the manner of a nut, driving gear 43 at a much slower rate according to the lesser pitch of the threads engaging worm 51 with worm 52, thus fine tuning the mechanism. The fine tuning will continue until gear 55 is turned sufficiently to re-engage projection 61 with projection 62, at which time coarse tuning will be resumed.

The tuning mechanism may therefore be operated to coarse tune a tuner for wave signal apparatus by rotation of control shaft 41 until the mechanism is just past the desired position. The rotation of shaft 41 may then be reversed and the receiver fine tuned to the precise position desired. The mechanism is thereby capable of extremely precise tuning merely by rotating a single knob driven control shaft. Such precise tuning is highly desirable where, as shown in the drawings, presettable pushbutton operated assemblies are also used to tune the mechanism, and the frequency spectrum within which tuning is being done is perfectly broad. Under these latter circumstances the pushbutton assemblies must be preset very precisely because there is little room for error.

It may therefore be seen that the invention provides an improved mechanism for wave signal tuning apparatus, which mechanism is operable from a single knob driven control shaft with a minimum of manipulation for both coarse and fine tuning. In addition, the mechanism is low in cost and reliable of operation.

We claim:

1. A mechanism for coarse and fine adjustment of a driven gear from a single rotary member, including in combination, first and second mutually concentric worms in threaded engagement with each other, said second worm being in threaded engagement with the driven gear, with the threads engaging said second worm and the driven gear being of a substantially greater pitch than the pitch of the threads engaging said first and second worms, a rotary member coupled to said first worm for rotating the same, and stop means coupled to said first worm and rotatable therewith for engaging said second worm and turning said second worm with said first worm as a single unit, thereby effecting coarse adjustment of the driven gear through rotation of said second worm, said stop means being disengaged from said second worm for a given amount of rotation of said first worm in an opposite direction and permitting said first worm to turn relative to said second worm to drive said second worm axially with respect to said first worm, thereby effecting fine adjustment of the driven gear through axial movement of said second worm.

2. A mechanism for driving a wave signal tuner having a tuner gear for positioning movable tuning elements, said mechanism including in combination, a first worm and means for turning the same, a second worm concentric with the first worm, first thread means drivingly interconnecting said first and second worms, second thread means drivingly interconnecting said second worm with the tuner gear, said second thread means having substantially greater pitch than said first thread means, and stop means on said means for turning said first worm for engaging said second worm and turning said second worm with said first worm as a single unit, thereby coarse tuning the tuner by rotating the tuner gear through rotation of said worm, said stop means being disengaged from said second worm for a given amount of rotation of said first worm in an opposite direction and permitting said first worm to turn relative to said second worm to drive said second worm axially with respect to said first worm, thereby fine tuning the tuner by rotating the tuner gear through axial movement of said second worm.

3. A tuning mechanism for an ultra high frequency wave signal tuner having movable tuning elements, said tuning mechanism including in combination, rotatable means for positioning the movable tuning elements, a plurality of pushbutton operable slide assemblies engageable with said rotatable means for positioning the same according to a predetermined setting of each of said assemblies, a tuner gear for positioning said rotatable means, clutch means coupled between said rotatable means and said tuner gear to disengage the same upon operation of said pushbutton, first and second mutually concentric worms in threaded engagement with each other, said second worm being in threaded engagement with said tuner gear with the threads engaging said second worm and the tuner gear being of substantially greater pitch than the pitch of the threads engaging said first and second worms, a manually rotatable control shaft and means coupling the same to said first worm for rotating the same, and stop means on said means for rotating said first worm for engaging said second worm and turning said second worm with said first worm as a single unit, thereby coarse turning the tuner by rotating the tuner gear through rotation of said second worm, said stop means being disengaged from said second worm for a given amount of rotation of said first worm in an opposite direction and permitting said first worm to turn relative to said second worm to drive said second worm axially with respect to said first worm, thereby fine tuning the tuner by rotating the tuner gear through axial movement of said second worm.

4. A mechanism for driving a wave signal tuner having a tuner gear for positioning movable tuning elements, said mechanism including in combination, a first worm and means for turning the same, a second worm concentric with said first worm, a first thread means drivingly interconnecting said first and second worms, second thread means drivingly interconnecting said second worm with the tuning gear, said second thread means having substantially greater pitch than said first thread means, a first projection extending from said second worm, a second projection extending from said means for turning said first worm and engageable with said first projection for turning said second worm with said first worm as a single unit, thereby coarse tuning the tuner by rotating the tuner gear through rotation of said second worm, said first and second projections being disengageable from each other upon rotation of said first worm in the opposite direction and remaining disengaged throughout a given amount of rotation of said first worm, permitting said first worm to turn relative to said second worm until said first and second projections re-engage, said second worm turning with respect to said first worm to fine tune the tuner by rotating the tuner gear through axial movement of said second worm with respect to said first worm.

5. A mechanism for driving a wave signal tuner having a tuner gear for positioning movable tuning elements, said mechanism including in combination, an inner worm having a gear portion coaxial therewith, a drive gear engaging said gear portion on said first worm, a manually operable tuner shaft coupled to said drive gear and rotatable to rotate said inner worm, an outer worm concentric with said inner worm, first thread means drivingly interconnecting said inner and outer worms, second thread means drivingly interconnecting said outer worm with the tuner gear, said second thread means having substantially greater pitch than said first thread means, and stop means on said gear portion of said inner worm for engaging said outer worm and turning said outer worm with said inner worm as a single unit, thereby coarse tuning the tuner by rotating the tuner gear through rotation of said outer worm, said stop means being disengaged from said outer worm for a given amount of rotation of said inner worm when the direction of rotation of said inner worm is reversed, said stop means when disengaged permitting said inner worm to turn relative to said outer worm to drive said outer worm axially with respect to said inner worm, thereby fine tuning the tuner by rotating the tuner gear through axial movement of said outer worm.

6. A tuning mechanism for an ultra high frequency wave signal tuner having movable tuning elements therein, said tuning mechanism including in combination, a treadle type mechanism for positioning the movable tuning elements, a plurality of presettable pushbutton operable slide assemblies for positioning said treadle type mechanism upon depression of an associated pushbutton, a tuner gear coupled to said treadle type mechanism for operating the same independently of said slide assemblies, clutch means coupled between said treadle type mechanism and said tuner gear to disengage the same upon operation of said pushbutton an inner worm and manually operable means for turning the same, an outer worm concentric with said inner worm, first thread means drivingly interconnecting said inner and outer worms, second thread means drivingly interconnecting said outer worm with said tuner gear, said second thread means having substantially greater pitch than said first thread means, a projection extending from said outer worm, a second projection extending from said manually operable means for turning said inner worm and engageable with said first projection to turn said outer worm with said inner worm as a single unit, thereby coarse tuning the tuner by rotating said tuner gear through rotation of said outer worm, said first and second projections being disengageable upon rotation of said inner worm in the reverse direction for a given amount of rotation of said inner worm and permitting said inner worm to turn relative to said outer worm to drive said outer worm axially with respect to said inner worm, thereby fine tuning the tuner by rotating said tuner gear through axial movement of said outer worm.

References Cited by the Examiner

UNITED STATES PATENTS 3,019,707 2/1962 Straat ------------ 74—10.5 X

References Cited by the Applicant

UNITED STATES PATENTS 2,118,859 5/1938 Newman.
2,192,084 2/1940 Kamenarovic.

MILTON KAUFMAN, *Primary Examiner.*